(12) United States Patent
Oyama

(10) Patent No.: US 6,860,002 B2
(45) Date of Patent: Mar. 1, 2005

(54) ELECTRIC COMPONENT MOUNTING APPARATUS

(75) Inventor: Kazuyoshi Oyama, Ashikaga (JP)

(73) Assignee: Sanyo Electric Co., Ltd., Osaka (JP)

( * ) Notice: Subject to any disclaimer, the term of this patent is extended or adjusted under 35 U.S.C. 154(b) by 342 days.

(21) Appl. No.: 09/961,386

(22) Filed: Sep. 25, 2001

(65) Prior Publication Data

US 2002/0042987 A1 Apr. 18, 2002

(30) Foreign Application Priority Data

Sep. 26, 2000 (JP) .................................... 2000-292533

(51) Int. Cl.[7] ................................................ H05K 3/30
(52) U.S. Cl. ........................... 29/740; 29/739; 29/741; 29/720; 29/832
(58) Field of Search ........................ 29/739, 740, 741, 29/720, 832

(56) References Cited

U.S. PATENT DOCUMENTS 5,588,195 A    12/1996  Asai et al.
6,044,169 A  *  3/2000  Hirotani et al. ............. 382/145
6,606,785 B1 *  8/2003  Kadohata et al. ............. 29/740

FOREIGN PATENT DOCUMENTS

EP           0 821 549 A2    1/1998

* cited by examiner

Primary Examiner—Richard Chang
(74) Attorney, Agent, or Firm—Morrison & Foerster LLP

(57) ABSTRACT

When both first and second preferred nozzles are set up as valid, and both nozzles are stored in a nozzle stocker, the replacement with the recommended nozzle stored in the stocker is made and a CPU controls the operation based on control data. When both are set up as valid, but only the second preferred nozzle, not the first preferred nozzle, is stored in the stocker, the CPU 20 recognizes which nozzle is available by using nozzle positioning data stored in a RAM, and then the replacement with an alternative nozzle is made, and the CPU controls the operation according to the control data of the alternative nozzle.

7 Claims, 8 Drawing Sheets

FIG.3

| step number | X(mm) | Y(mm) | θ (angle) | FDR | C |
|---|---|---|---|---|---|
| 0000 | + 0.00 | + 0.00 | + 0° 00' | 000 | — |
| 0001 | 10.00 | 120.00 | 0° 00' | 101 | — |
| 0002 | 15.00 | 130.00 | 90° 00' | 101 | — |
| 0003 | 20.00 | 150.00 | 0° 00' | 103 | — |
| 0004 | 60.00 | 50.00 | 180° 00' | 103 | — |
| 0005 | 110.00 | 80.00 | 270° 00' | 105 | — |
| 0006 | 210.00 | 220.00 | 0° 00' | 105 | — |
| 0007 | 310.00 | 120.00 | 180° 00' | 107 | — |
| 0008 | 310.00 | 20.00 | 90° 00' | 110 | — |
| 0009 | 180.00 | 50.00 | 0° 00' | 110 | — |
| 0010 | 160.00 | 80.00 | 270° 00' | 110 | — |
| 0011 | 290.00 | 220.00 | 0° 00' | 110 | — |
| 0012 | 0.00 | 0.00 | 0° 00' | 000 | E |

FIG.4

| FDR NO | ◀ component ID ▶ | C | comment |
|---|---|---|---|
| 101 | C3216 | — | |
| 103 | R1005 | — | |
| 105 | SOP14 | — | |
| 107 | QFP100-0001-0500 | — | |
| 110 | VQFP48 | E | |

FIG.6

| PICK-UP RETENTION TIME | | 0.00 sec | SPEED DATA | BEAM(X/Y) | FULL SPEED |
|---|---|---|---|---|---|
| PLACEMENT RETENTION TIME | | 0.00 sec | | PICK-UP DESCENT | FULL SPEED |
| | | | | PICK-UP ASCENT | FULL SPEED |
| | | | | PLACEMENT DESCENT | FULL SPEED |
| | | | | PLACEMENT ASCENT | FULL SPEED |
| | | | | NOZZLE ROTATION | FULL SPEED |
| | | | | RECOGNITION TIME | 0.10 sec |

| COMPONENT POSITION CORRECTION | X | + 0.0 mm | PICK-UP LEVEL | + 0.10 mm |
| --- | --- | --- | --- | --- |
| | Y | + 0.0 mm | PLACEMENT LEVEL | + 0.30 mm |
| PICK-UP LOCATION ADJUSTMENT | X | + 0.0 mm | FOCUS ADJUSTMENT | + 0.00 mm |
| | Y | + 0.0 mm | ERROR PROCESS DATA 1 | 2 |
| AUTOMATIC FOR AXIS ADJUSTMENT | X | ON | ERROR PROCESS DATA 2 | 2 |
| | Y | ON | | |

FIG.7

| PICK-UP RE | 0.10 sec |
|---|---|
| PLACEMENT RETENTI | 0.00 sec |

| SPEED DATA | BEAM(X/Y) | 50%DECELERATION |
|---|---|---|
| | PICK-UP DESCENT | 50%DECELERATION |
| | PICK-UP ASCENT | 50%DECELERATION |
| | PLACEMENT DESCENT | 50%DECELERATION |
| | PLACEMENT ASCENT | 50%DECELERATION |
| | NOZZLE ROTATION | 50%DECELERATION |
| | RECOGNITION TIME | 0.10 sec |

| COMPONENT POSITION CORRECTION | X | + 0.0 mm |
| | Y | + 0.0 mm |
| PICK-UP LOCATION ADJUSTMENT | X | + 0.0 mm |
| | Y | + 0.0 mm |
| AUTOMATIC FOR AXIS ADJUSTMENT | X | ON |
| | Y | ON |

| PICK-UP LEVEL | + 0.10 mm |
|---|---|
| PLACEMENT LEVEL | + 0.30 mm |
| FOCUS ADJUSTMENT | + 0.00 mm |
| ERROR PROCESS DATA 1 | 2 |
| ERROR PROCESS DATA 2 | 2 |

FIG.8
① When it was changed for the first preferred nozzle.
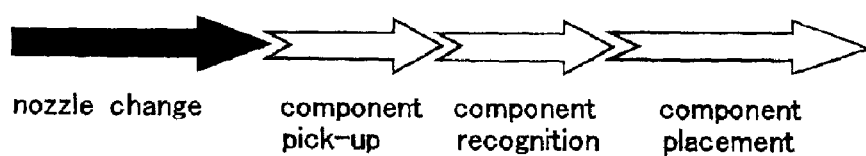
② When operation was continued with the second preferred nozzle.
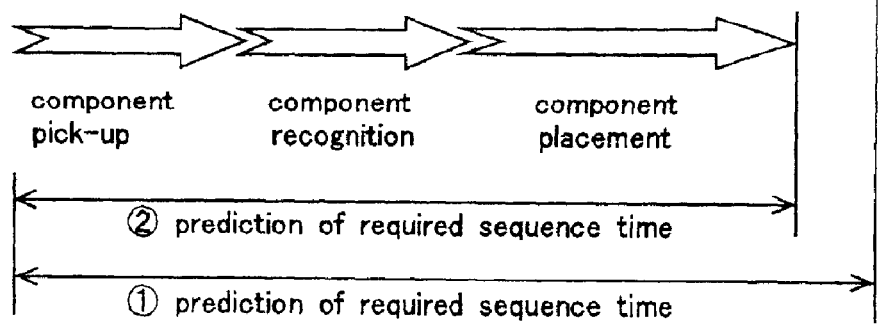

ELECTRIC COMPONENT MOUNTING APPARATUS

BACKGROUND OF THE INVENTION

1. Field of the Invention

This invention relates to an electronic component mounting apparatus, in which a suction nozzle mounted on a mounting head picks up electronic components from an electronic component feeding apparatus and mounts the electronic components on a print board.

2. Prior Art

The conventional electronic component mounting apparatus is configured in such a way that each of the suction, recognition, and mounting operation of an electronic component can be designated in detail by parts library data in order to establish the individual handling control for the component.

An editing procedure will be explained hereinafter in reference to the editorial screen of the parts library displayed on a CRT shown in FIG. 9.

The doubly framed parts in the screen displayed on the CRT are the switch portion of a touch panel switch, with which each data of each electronic component can be edited and set up. In this particular display, the component ID is "QFP100-0001-0500", the component form is "flat packaged", the lighting mode is "reflection" and the nozzle ID of the nozzle type (suction nozzle) is "MF01". Shape data, recognition data, control data and feeder data can also be entered.

Here, the nozzle type is classified by its tip size, shape, length and other characteristics of the nozzle and managed by a nozzle ID. The nozzle ID is a four-digit combination of letters and numbers and designates for each component "a nozzle" for picking up the component. The nozzle ID "MF01" in the screen denotes a standard nozzle with a hollow and round cross section at its suction part (it will be referred to a round nozzle hereinafter).

Here, by touching "shape data" and changeable each "key", the type, size, thickness, and polarity of the component can be selected or entered. Likewise, by touching "recognition data" and each key, the recognition algorithm, lighting data, component size capacity and other data can be selected and entered. Also, by touching "control data" and each key, the pick-up retention time, the placement retention time, and the speed of each suction, transportation and mounting operation can be selected and entered. And by touching "feeder data" and each key, the mode of component feeding and the speed of component feeding can be selected and entered.

Finally by touching the "set key", the set-up of parts library data is completed and the data is stored in RAM (not shown in the figure). Then, a control device controls the movement of a mounting head based on the data of the parts library data corresponding to each electronic component stored in the RAM, for picking up electronic component from a component feeding apparatus by a suction nozzle mounted on the mounting head and for mounting the component on a print board.

As described above, in the parts library data, only one recommended nozzle is allocated as the suction nozzle type for picking up the electronic component. And the direction to reduce the speed of the suction nozzle during its rotation as well as the transportation in XY directions after the component pick-up is set up based on this allocation.

Therefore, when a desirable nozzle can not be prepared at a production site, and if an alternative nozzle is used as an emergency measure, the ID of the alternative nozzle should be set up as the nozzle type. Thus, the direction to reduce the speed needs to be changed accordingly and the data should be altered and managed as a new parts library data (the data should be newly registered with a different component ID).

Thus, if an operator accidentally overwrites under the same name as the previous "component ID" after the change of the data described above is made, the data based on the recommended nozzle will be lost resulting in the alternation of data.

SUMMARY OF THE INVENTION

Therefore, this invention is directed to enabling the designation of an alternative nozzle along with the designation of the recommended nozzle. Also, since the data regarding the control during component handling is influenced by the designation of the nozzle, this invention includes the independent set-up and registration of the control data for each nozzle.

Therefore, the electronic component mounting apparatus of this invention, where electronic component is picked up by a suction nozzle mounted on a mounting head from an electronic component feeding apparatus and mounted on a print board, includes a memory device storing parts library data which can designate a suction nozzle for each of the electronic components from a plurality of suction nozzle types and a control device which controls the apparatus so that the designated nozzle picks up and mounts the electronic component based on the parts library data stored in the memory device.

Also, the electronic component mounting apparatus of this invention comprises the memory device which stores parts library data for designating a suction nozzle for each of the electronic component from a plurality of suction nozzle types and which also stores the corresponding control data on the suction nozzle, and the control device which controls the apparatus so that the designated nozzle picks up and mounts the electronic component based on the parts library data stored in the memory device.

Also, in this invention, the parts library data is used to designate a suction nozzle from a plurality of the suction nozzle types based on the order of priority.

Additionally, the component mounting apparatus of this invention also includes a nozzle stocker for storing the suction nozzles, a memory device which stores the nozzle positioning data on the location of a nozzle stored in the nozzle stocker, and a control device which selects a suction nozzle based on the order of priority using the nozzle positioning data as well as the parts library data both stored in the memory device.

Furthermore, the parts library data, which can be used to designate a suction nozzle from a plurality of suction nozzle types, also includes the data for showing whether the designation of the suction nozzle is valid or invalid for each type of the nozzle.

Also, the control data is the data on the transportation speed of the suction nozzle.

In prior art, when a desirable nozzle can not be prepared at a production site, and if an alternative nozzle is used as an emergency measure, the ID of the alternative nozzle should be set up as the nozzle type. Thus, the direction to reduce the speed needs to be changed accordingly and the data should be altered and managed as new parts library data (the data should be newly registered with a different component ID). Also, if an operator accidentally overwrites under the same name as the previous "component ID" after the change of the data described above is made, the data based on the recommended nozzle will be lost resulting in the alternation of data. However, the mounting apparatus of this invention can prevent this sort of problem since it enables the designation of an alternative nozzle along with the designation of the recommended nozzle. Also, in this invention, the control data can be independently set up and registered for each nozzle, because the control data for component handling changes according to the designation of the nozzle.

BRIEF DESCRIPTION OF THE DRAWING

FIG. 3 shows a set of mounting data.

FIG. 4 shows a set of component positioning data.

FIG. 6 shows a set of control data of the first preferred nozzle.

FIG. 7 shows a set of control data of the second preferred nozzle.

FIG. 8 shows the time difference between the cases with and without the nozzle replacement.

THE DETAILED DESCRIPTION OF THE PREFERRED EMBODIMENTS

Figure 1:
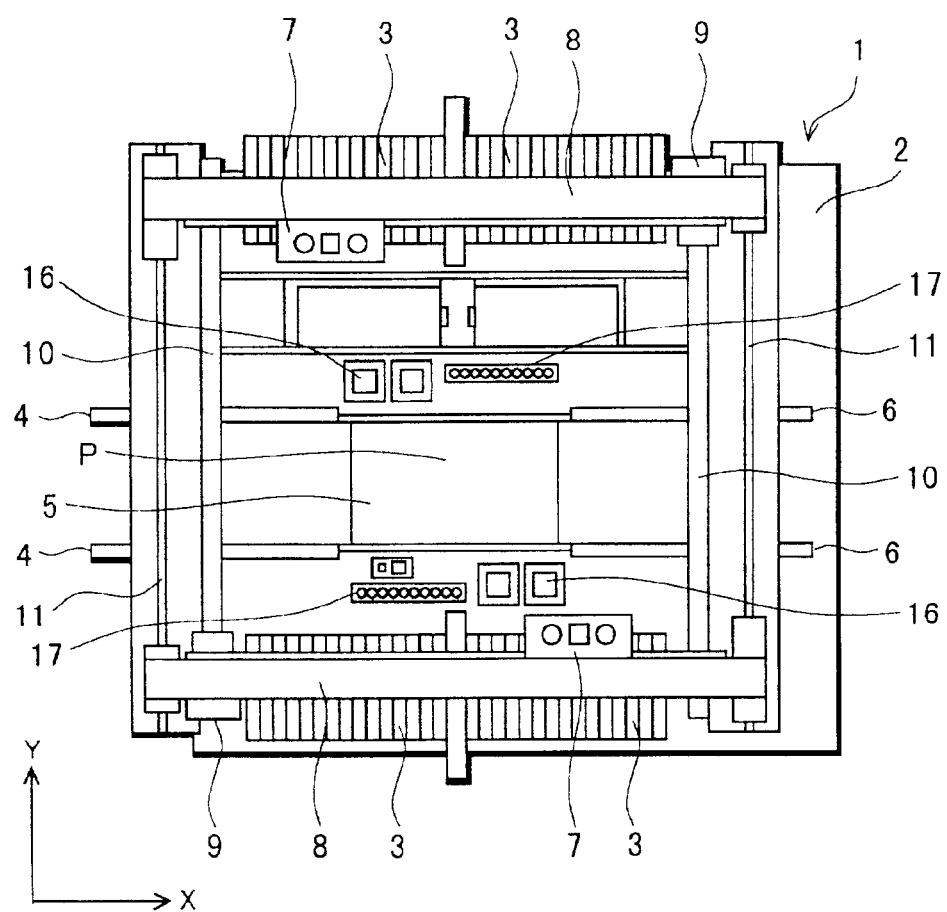
FIG. 1 is a plan view of an electronic component mounting apparatus of one embodiment of this invention.

Now, an embodiment of the electronic component mounting apparatus based on this invention will be described referring to the drawings hereinafter.

FIG. 1 is a plan view of an electronic component mounting apparatus 1. On a base 2 of the apparatus 1, a plurality of component feeding units 3 that feed one component of various kinds of electronic components at a time to each component pick-up portion (component suction position) are juxtaposed. Between the groups of the unit 3 facing each other, feeding conveyers 4, a positioning portion 5 and exhausting conveyers 6 are mounted. The feeding conveyer 4 receives the print board P from upper stream and sends the print board to the positioning portion 5. After an electronic component is mounted on the print board positioned by a positioning mechanism, not shown in the figure, of the positioning portion 5, the print board is sent to the exhausting conveyer 6.

Reference numeral 8 denotes a pair of beams that extends in X direction, and moves the print board P or the upper part of the component pick-up portion (component suction position) of the feeding unit 3 individually in Y direction along with a pair of the parallel guides 11 by rotating the screw axis 10 by the drive of Y axis motor 9.

A mounting head 7 that moves in X direction, which is the longitudinal direction, along the guide (not shown in the figure) by the drive of an X axis motor 12 is mounted on each beam 8. On each mounting head 7, two vertical axis motors 14 that move two suction nozzles (not shown in the figure) in vertical direction and two θ axis motors for rotating the suction nozzles around vertical axis are mounted. Therefore, it is possible for each of the two suction nozzles on the mounting head to move in X and Y directions, to rotate around vertical axis, and to move upwards and downwards. Also, by mounting one θ axis motor that makes mounting head rotate around the vertical axis and one vertical axis motor that moves mounting head upwards and downwards, it is possible to move only the selected suction nozzles upwards and downwards.

Reference numerical 16 denotes a recognition camera for recognizing component position. There are two cameras for each of the mounting heads 7 and four cameras in total. The camera performs the imaging of an electronic component for recognizing the amount of positioning error of the electronic component relative to the suction nozzle in X and Y direction, and rotation angle. Each camera can perform imaging of each electronic component that is picked up by the suction nozzle. Reference numerical 17 denotes a stocker for storing nozzles. Although the stocker can store ten nozzles, it stores only nine nozzles in this embodiment leaving at least one place for the suction nozzle to be replaced.

Figure 2:
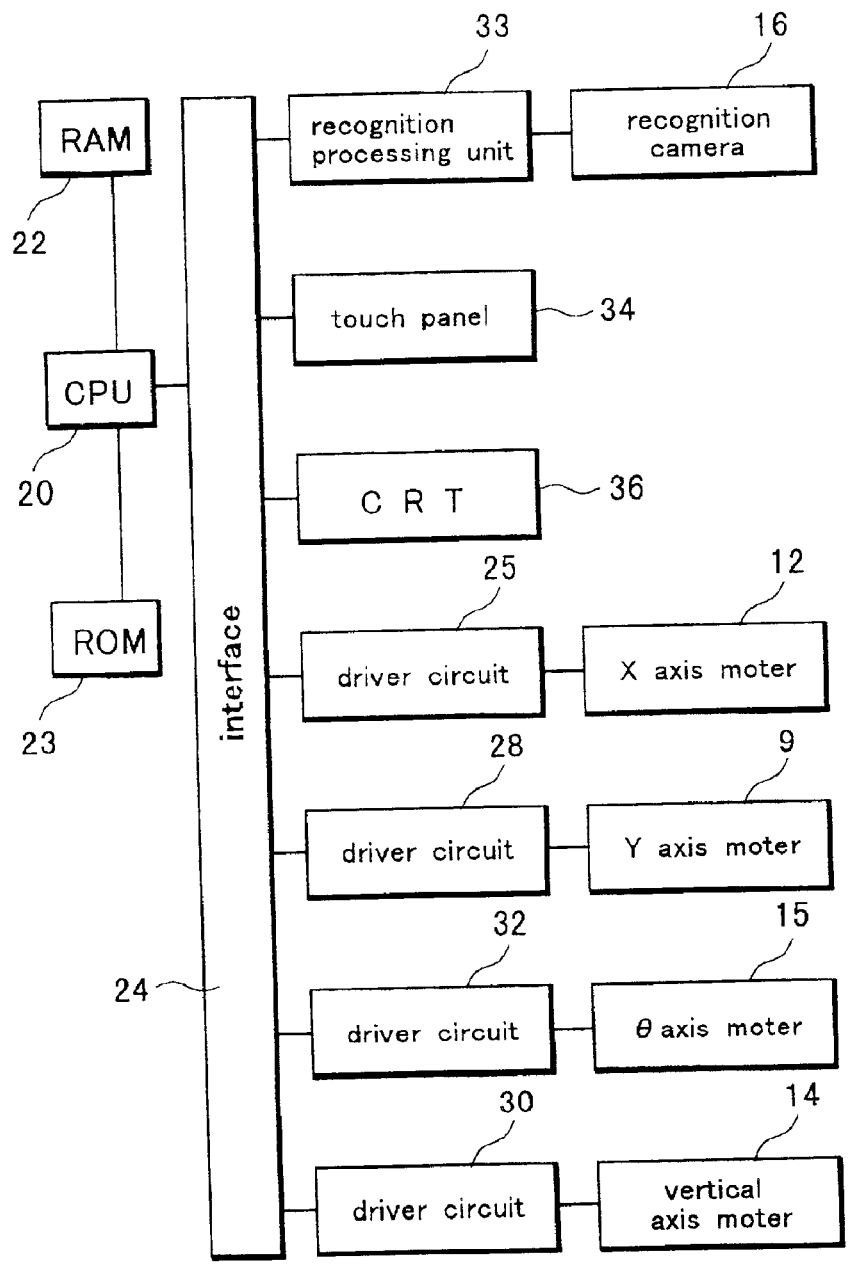
FIG. 2 is a block diagram for controlling an electronic component mounting apparatus of FIG. 1.

FIG. 2 is a block diagram for controlling the electronic component mounting apparatus. One each of X axis motors 12, Y axis motors 9, θ axis motors 15 and vertical axis motors 14 are shown in the figure as a matter of convenience.

Reference numerical 20 indicates a CPU (mounting controlling unit) as a controlling unit that controls the mounting apparatus 1. To the CPU 20, RAM (random access memory) 22 and ROM (read only memory) 23 are connected through bus-line. CPU 20 controls the movements related to the component mounting procedure of electronic component mounting apparatus 1 based on the data stored in the RAM 22 and in accordance with the program stored in the ROM 23.

That is, CPU 20 controls the movements of the X axis motor 12 through interface 24 and driver circuit 25, the movements of the Y axis motor 9 through interface 24 and driver circuit 28, the movements of the θ axis motor 15 through interface 24 and driver circuit 32, and the movements of the vertical axis motor 14 through interface 24 and driver circuit 30.

Mounting data related to component mounting as shown in FIG. 3 is stored in the RAM 22. For each step of the mounting (at each step number), the information on X direction (indicated by X), Y direction (indicated by Y) and angle (indicated by θ)in a print board and the information on positioning number (indicated by FDR) of each component feeding unit 3 are stored. In the RAM 22, the component positioning data, as shown in FIG. 4, is stored. Here, the type of each component (component ID) corresponding to the positioning number of the component feeding unit 3 is stored. Also, in the RAM 22, the parts library data that identify characteristics of each component is stored. This will be explained in detail later.

Reference numerical 33 denotes a recognition processing unit connected to the CPU 20 through interface 24 and the recognition processing of the images taken by the recognition camera 16 is performed based on the parts library data at the recognition processing unit 33, and then the result of the processing is sent to CPU 20. That is, CPU 20 outputs the direction to the recognition processing unit 33 to perform recognition processing (to calculate the amount of adjustment) on the image taken by the recognition camera 16, and receives the result of the recognition processing from the recognition processing unit 33.

Reference numeral 34 denotes a touch panel switch mounted on a screen of CRT 36 of the mounting equipment not shown in the figures. The entire surface of the glass substrate of the touch panel 34 is coated with transparent conduction film, and an electrode is printed on each of the four sides of the panel. Also, electric current of extremely small amplitude is applied on the surface of the touch panel 34. Thus, when an operator touches the panel, the change of electric current takes place in the electrodes on the four sides of the panel, and then the circuit board connected to the electrodes calculates the X Y coordinates of the place being touched. When the calculated X Y coordinates are identified with one of the X Y coordinates which are pre-stored in the RAM 22 as switch portions for initiating certain kinds of operation, the operation starts. In this embodiment, the doubly framed parts in the screen displayed on the CRT 36 are stored as the switch portion for each of the displayed screen (see FIG. 5).

In the RAM 22, a plurality of formats for preparing the parts library data is stored.

Figure 5:
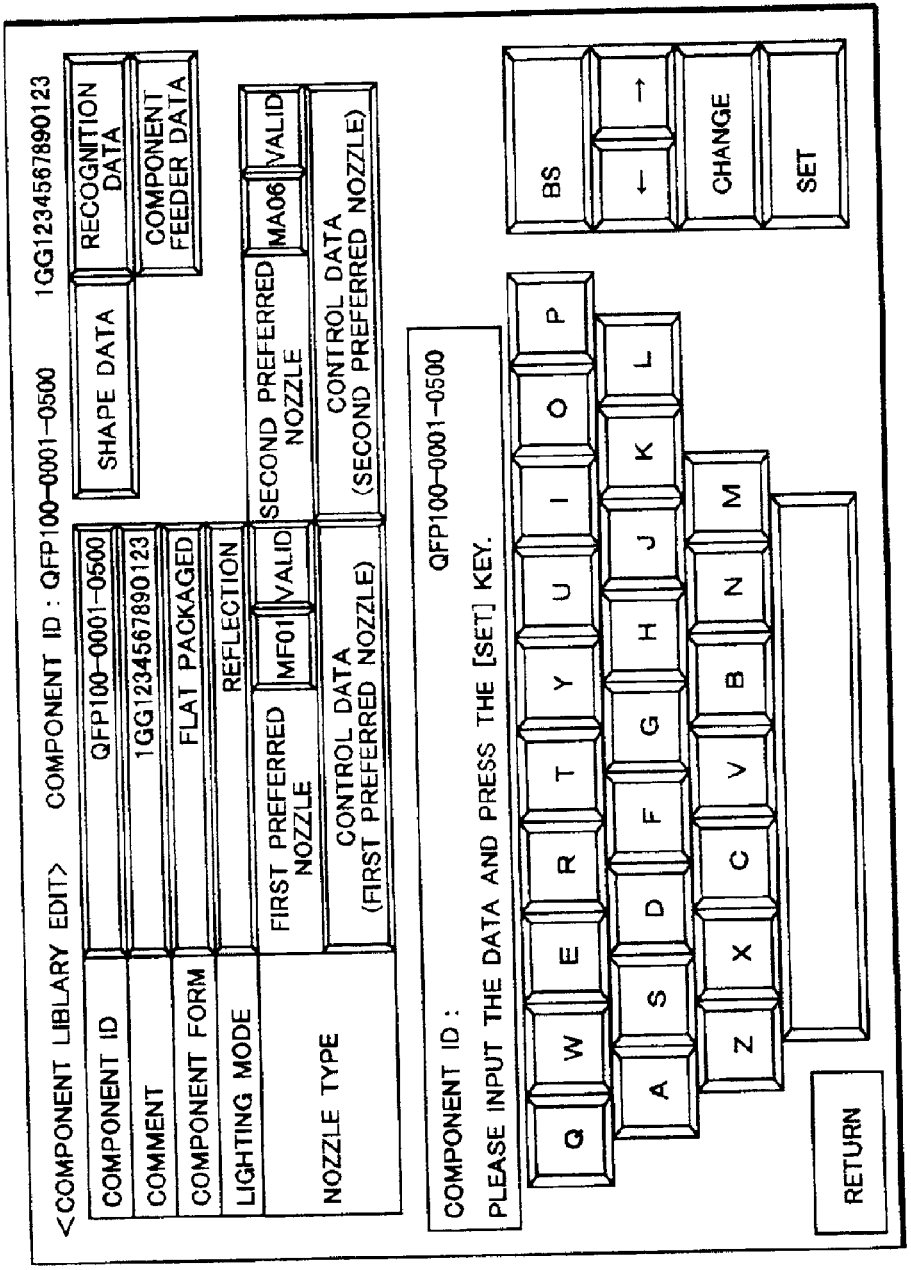
FIG. 5 shows a parts-library editorial screen displayed on a CRT.
Figure 9:
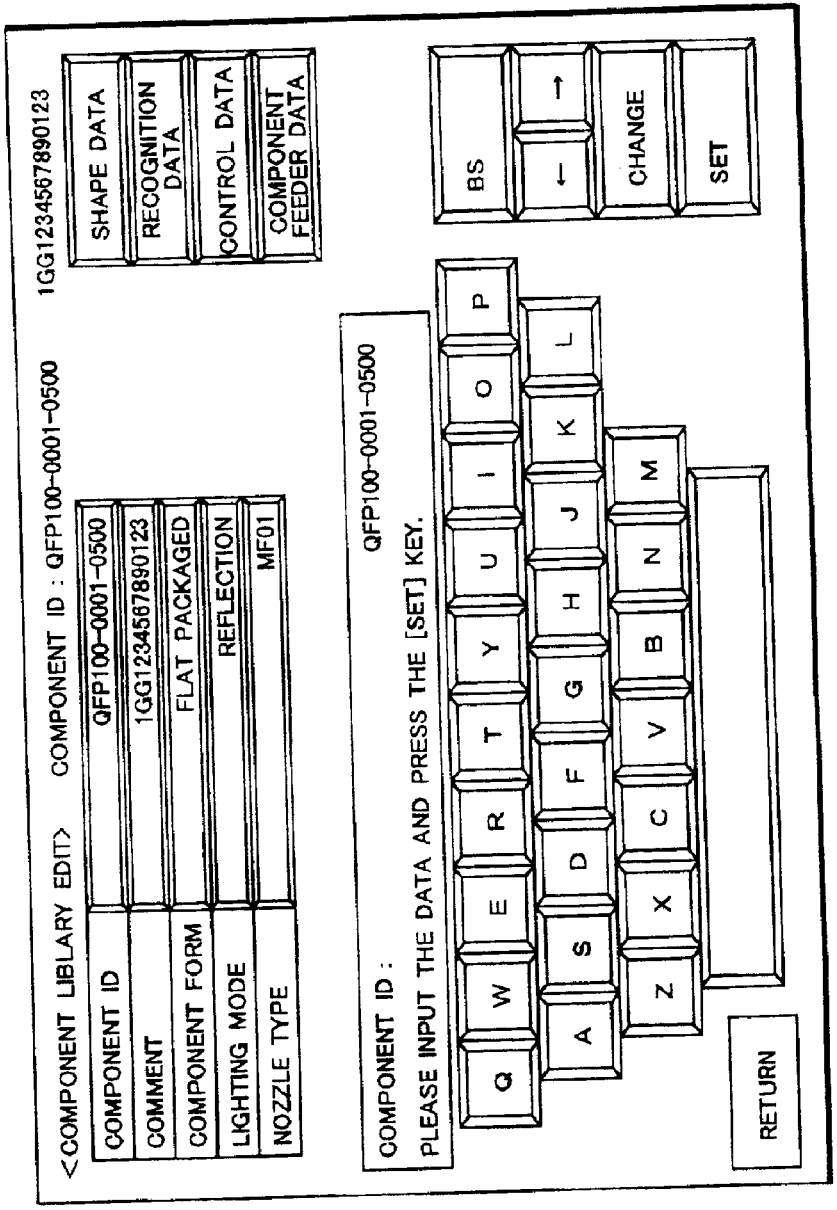
FIG. 9 shows a parts-library editorial screen displayed on a CRT of prior art.

Next, the operation for registering the parts library data to the RAM 22 by using the electronic component mounting apparatus as an electronic component data preparing device is explained based on FIG. 5.

In FIG. 5, which is the editorial screen of the parts library displayed on the CRT 36, the component ID is "QFP100-0001-0500", the component form is "flat packaged", and the lighting mode is "reflection". Shape data, recognition data, and feeder data can also be entered.

As the nozzle type for the electronic component, the recommended nozzle is set up as "the first preferred" nozzle and the alternative nozzle as "the second preferred" nozzle. That is, in this embodiment, as "the first preferred" nozzle, the suction nozzle with the nozzle ID "MF01", and as "the second preferred" nozzle, the suction nozzle with the nozzle ID "MA06" are set up by pressing the switch portion of the each key. The nozzle ID "MF01" indicates a standard round nozzle, and the nozzle ID "MA06" indicates a nozzle with narrower external and internal diameters compared to those of the "MF01" nozzle. Here, although only "the second preferred" nozzle is designated as the alternative nozzle, a plurality of additional nozzles such as "the third preferred" nozzle can also be designated.

By pressing the switch portion displaying "shape data", the editorial screen of the "shape data" appears on the CRT 36, and the selections or inputs of the type, size, thickness and polarity of the component become possible. Likewise, by pressing the switch portion displaying "recognition data", the selections or inputs of the recognition algorithm, the lighting data, the component size capacity become possible. Also, by pressing the switch portion displaying "feeder data", the selections or inputs of the mode of component feeding and the speed of component transportation become possible.

Also by pressing the switch portion displaying "control data (the first preferred nozzle)", the editorial screen of the "control data (the first preferred nozzle)" appears on the CRT 36, and the pick-up retention time, the placement retention time, the speed of vertical movements for pick-up, and the speed of vertical movements for mounting can be selected or entered. Also, by touching the switch portion displaying "control data (the second preferred nozzle)", the editorial screen of the "control data (the second preferred nozzle)" appears on the CRT 36, and the pick-up retention time, the placement retention time, the speed of vertical movements for suction, and the speed of vertical movements for mounting can be selected or entered. That is, for the electronic component with component ID "QFP 100-0001-0500", a plurality of suction nozzles (two nozzles in this embodiment) can be designated and the "control data" corresponding to each nozzle can be registered.

The "control data" is explained in detail hereinafter. First of all, the data on "the pick-up retention time" is the data for setting up the retention time at the lowest limit of the nozzle during the pick-up. This data can be used when the suction is unstable due to the influence from component surface or the mismatch between a component and a nozzle. The input data range is from 0.00 to 1.99 seconds. The data on "the placement retention time" is the data for setting up the retention time at the lowest limit of the nozzle during mounting, and the input data range is from 0.00 to 1.99 seconds.

The "speed data" is the data for controlling the movement of the beam 8, pick-up decent, pick-up ascent, placement decent, placement ascent, and nozzle rotation during the time from the suction to the mounting. This can be done by controlling the X-axis motor 12, the Y-axis motor 9, the θ axis motor 15 and the vertical motor 14 by using the data for designating the acceleration or deceleration rate in relation to the standard driving waveform, or the data for designating the deceleration from full speed. The designation ranging from "no deceleration" to "90% deceleration" is possible. Also, the data on "recognition processing" is the data about the approximate time for component recognition processing, and is used to achieve the optimum processing in the apparatus (for example, it is used for the automatic mounting data sorting processing which arranges the order of the components to be mounted in order to shorten the mounting time).

The next one is the "component position correction" data. The standard position at the time of suction of each type of the component in component feeding unit 3 is managed by this data. When this standard position is different from the central position of the component in the tape, the position is corrected by using this data. The input data range is from −99.9 mm to +99.9 mm. Also, "pick-up location correction" data is used for shifting the pick-up location from the center of the component when the suction at the center of the component is difficult because of the presence of a groove or a projected object at the center. In this case, the automatic feeder axis adjustment mechanism of the pick-up location works to maintain a correct location for pick-up. The input data range is from −99.9 mm to +99.9 mm. Additionally, "automatic feeder axis adjustment" data is used to decide if the automatic feeder axis adjustment mechanism of the pick-up location correction (in X and Y-directions) should be used or not based on the result of component recognition. This adjustment mechanism will be operational by setting the "on" up.

The next one is the "pick-up level" data for adjusting the level of downward movement of the mounting head 7 at the time of suction. When embossed carrier tape is used, a gap between the tape depth and the component thickness is created in some cases. This data can be used for adjusting the movements in those cases. When the downward stroke of the mounting head at the time of suction needs an increase (when the head needs to be moved downward further toward the base surface), plus value should be entered. The input data range is −99.9 mm to +99.9 mm.

The "placement level" data is the data for adjusting the level of downward movement of the mounting head 7 at the time of component mounting. Although the level of downward movement of the mounting head at the time of mounting is controlled based on the data on the component thickness in the "shape data", the adjustment can be made by using this data when the downward stroke of the mounting head 7 needs to be altered. Usually, the value capable of absorbing the downward curvature of the base (plus value) is set up. When the downward stroke of the mounting head at the time of mounting needs an increase (when the head needs to be moved downward further toward the base surface), plus value should be entered. The input data range is −99.9 mm to +99.9 mm.

The "focus adjustment" data is the data for adjusting the focus level at the time of component recognition. Usually, the level of the height at the time of component recognition is decided based on the data on the component thickness in the "shape data". However, if the targeted position for the component recognition is out of focus due to the shape of the component, this data is used for the necessary adjustment. The input data range is −99.9 mm to +99.9 mm.

The "error processing 1" data is for the cases when a component can not be picked up (no-component). The data is used to designate the number of consecutive erroneous operations of no-component for making an emergency stop of the apparatus. If the alternate mechanism is set up, the designated number works as the condition for starting the alternate mechanism. And if the set-up value is "1", the apparatus will stop at the first detection of a no-component. If the set-up value is "2", the apparatus will stop when two consecutive errors of no-component are detected in the same component feeding unit 3. The input data range is from 1 to 9.

The "error processing 2" data is the data for inspecting the consecutive erroneous pick-up caused by the erroneous component recognition (erroneous pick-up of a component). The data is used to designate the number of consecutive erroneous operations for making an emergency stop of the apparatus. If the alternate mechanism is set up, the designated number works as the condition for starting the alternate mechanism. And if the set-up value is "1", the apparatus will stop at the first detection of an erroneous component recognition. If the set-up value is "2", the apparatus will stop when two consecutive errors of the component recognition are detected in the same component feeding unit 3. The input data range is from 1 to 9.

By selecting or entering each data in the manner described above, the "control data (the first preferred nozzle)" shown in FIG. 6 and the "control data (the second preferred nozzle)" shown in FIG. 7 are prepared. The "speed data" needs a special attention. The alternative nozzle set up as the "second preferred" nozzle is the suction nozzle with ID of "MA06" and the round nozzle with the narrower external and internal diameters compared to those of the recommended nozzle with ID of "MF01". Thus, if the "MA06" is transported horizontally or vertically, or rotated with the same speed as "MF01", a positioning error of the electronic component being picked up by the suction nozzle as well as the dropping off of the electronic component from the suction nozzle may take place. Therefore, the "speed data" should be set up, for example, as "50% deceleration".

Also, in the practical production, for effectively controlling the apparatus, the "valid" and "invalid" set-up data for deciding whether the nozzle type data set up as described above should be used or not is also added (see FIG. 5). That is, in case that the second preferred nozzle is not designated, the space for designating the ID of the second preferred nozzle as the nozzle type can be left blank (not entered). Also, the "invalid" key overrides the data set for the second preferred nozzle and the apparatus operates as if there is no data set for the nozzle. In FIG. 5, both the first and the second preferred nozzles are set up as "valid."

Finally, by pressing the switch portion displaying "set" on the editorial screen of the parts library in FIG. 5, the set-up of the parts library data of the electronic component is completed and the data is stored in the RAM 22 so that the parts library data of each electronic component can be prepared.

Also, the each of the suction nozzles stored in the nozzle stocker 17 is managed by the nozzle positioning data stored in the RAM 22. That is, the data defines location (address) of nozzles (nozzle ID) stored in the nozzle stocker. And, before the component pick-up operation, the CPU 20 decides what kind of nozzle should be used for picking up the particular component, then picks up a suitable nozzle from the nozzle stocker and then mounts the nozzle to the mounting head 7. Usually, this procedure is performed as a nozzle replacement procedure (the suction nozzle which has already mounted on the mounting head 7 is now being stored in the designated address of the stocker 17 and then the necessary nozzle is taken out from the nozzle stocker 17 and mounted on the mounting head 7). The targeted nozzle is expressed as the first preferred nozzle or the second preferred nozzle.

The operation based upon the data set-up described above will be explained hereinafter.

First of all, the print board P is transported by the conveyer not shown in the figures from upper stream through the feeding conveyer 4 to the positioning portion 5, and then positioned by the positioning mechanism.

Next, based on the mounting data (see FIG. 3), the component positioning data (see FIG. 4) and the parts library data (FIG. 5 and FIG. 7), which designate the X Y coordinates of the component mounting position on the print board P, rotating angle around the vertical axis, and positioning number, stored in the RAM 22 according to the step numbers, the component type C3216 of the electronic components with the mounting step numbers 0001 and 0002 and the suction nozzle corresponding to component type C3216 are designated. Then the suction nozzle picks up the electronic component from the designated component feeding unit 3 by suction. That is, each of the mounting head 7 moves to the position located above each of the designated component feeding unit 3 which stores the electronic component to be picked up. At this time, by the driver circuit 28, the Y axis motor 9 drives to move the beam 8 along with a pair of guides 9 in Y direction and by the driver circuit 25, the X axis motor 12 drives to move the mounting head 7 in X direction.

Each of the designated component feeding units 3 has already been driven to enable the component pick-up at the component pick-up position. Thus, the vertical motor 14 is now driven by the driver circuit 30 to move the suction nozzle downward to the upper surface of the component for picking it up by suction. At this time, two suction nozzles mounted on one of the mounting head 7 pick up electronic component simultaneously or independently.

Then, the suction nozzle moves up by the drive of each vertical axis motor 14. The Y axis motor 9 drives to move the beam 8 along with a pair of guides 9 in Y direction, and the X axis motor 12 drives to move the mounting head 7 in X direction for transporting each of the mounting head 7 to the position above the print board P. As to the component C3216 with the mounting step number 0001, the parts library data is set up to mount the component after the recognition processing. Thus, each of the mounting heads 7 stops at the position above each of the recognition camera 16 and the imaging of the component being picked up by each of the mounting heads 7 (the suction nozzle) is performed by each of the recognition camera 16. Based on the recognition result, the recognition processing unit 33 calculates the amount of adjustment in X and Y directions and rotating angle of the electronic component relative to the mounting head.

Then, based on the result from the recognition unit 33, the CPU 20 outputs the directions to move the beam 8 in Y direction by the drive of Y axis motor 9, move the mounting head 7 in X direction by the drive of the X axis motor 12, and rotate the suction nozzle by the drive of θ axis motor 15. The necessary adjustments of the position of one of the electronic component C3216 being picked up by the suction nozzle in X and Y directions and in rotating angle are made. After this adjustment, by the drive of the vertical axis motor 14, the suction nozzle moves downward and one of the electronic component is mounted at the right position on the print board P. Then the suction nozzle goes up by the drive of the vertical axis motor 14. In the same manner, the other electronic component C3216 is mounted on the print board P. If it is judged that the adjustment is needed based on the result of the recognition, the necessary adjustment is made before the mounting. And if the adjustment is not necessary, the component is immediately mounted on the print board P.

Next, an operation, in which the electronic components with the step number 0007 of the FDR 107 and the component ID QFP 100-0001-0500 are mounted successively, will be explained in detail according to the contents of the parts library data stored in the RAM 22.

When a suction nozzle of the highest priority for picking up the electronic component has not be mounted on the mounting head 7, it is necessary to use a suction nozzle of not highest priority stored in the nozzle stocker 17. This operation will be explained.

Generally, the recommended nozzle is set up as "the first preferred" nozzle and the alternative nozzle as "the second preferred nozzle". However, if the place for the nozzle ID of the second preferred nozzle is left blank or the second preferred nozzle is set up as "invalid", the nozzle replacement with the suction nozzle with the nozzle ID "MF01" (the recommended nozzle) stored in the nozzle stocker 17 is made. Then, according to the "control data (the first preferred nozzle)" of the parts library data of the electronic component stored in the RAM 22, the CPU 20 controls the X axis motor 12, Y axis motor 9, θ axis motor 15 and vertical axis motor 14 during the time from the suction to the mounting operations for controlling the movement of the beam 8, pick-up decent, pick-up ascent, placement decent, placement ascent, and nozzle rotation.

When both the first and second preferred nozzle types are set up as "valid" and both types of the nozzle are stored in the nozzle stocker 17, the nozzle replacement with the suction nozzle with the nozzle ID "MF01" (the recommended nozzle) stored in the nozzle stocker 17 is made. And the CPU 20 controls the operation as described above according to the "control data" (the first preferred nozzle). Suppose the case where both the first and second preferred of nozzle types are set up as "valid", but only the second preferred nozzle (nozzle ID "MA06"), not the first preferred nozzle (nozzle ID "MF01"), is stored in the nozzle stocker 17. In this case, the CPU 20 recognizes which nozzle is available by using the nozzle positioning data. Since the recommended nozzle is not available, the replacement with the alternative nozzle (the second preferred nozzle) is made, and the CPU 20 controls the operation according to the "control data (the second preferred nozzle)" of the alternative nozzle.

The alternative nozzle (nozzle ID "MA06") is the round nozzle with the narrower external and internal diameters compared to those of the recommended nozzle with ID of "MF01". Thus, if the "MA06" is transported horizontally or vertically, or rotated with the same speed as "MF01", a positioning error of the electronic component being picked up by the suction nozzle as well as the dropping off of the electronic component from the suction nozzle may take place. Therefore, the "speed data" is set up as "50% deceleration" for horizontal and vertical transportation and as "70% deceleration" for rotation. Thus, the CPU 20 controls the movements of the X axis motor 12 through interface 24 and driver circuit 25, the movements of the Y axis motor 9 through interface 24 and driver circuit 28, the movements of the θ axis motor 15 through interface 24 and driver circuit 32, and the movements of the vertical axis motor 14 through interface 24 and driver circuit 30 accordingly.

The operations of pick-up and mounting continue based on the order of the mounting step numbers.

Suppose the situation under the following conditions. Both the first and second preferred nozzle types are set up as "valid" and both types of the nozzle are stored in the nozzle stocker 17. The component mounting operation of a group of the components with the designation of the first preferred nozzle is performed through the nozzle replacement of the mounting head 7. Then, a group of components with the designations of both the first and second preferred nozzle comes up. Under this circumstance, the following situation will take place due to the sequence of the mounting head 7. That is, the first preferred nozzle has been already replaced with the second preferred nozzle on the mounting head 7 for the next component to be picked up.

In this case, there is a freedom to choose whether a pick-up should be done after nozzle replacement with the first preferred nozzle or it should be done by the second preferred nozzle. This freedom can be effectively utilized for the improvement of the production efficiency. That is, if the nozzle replacement with the first preferred nozzle is chosen, the additional time for the replacement is required, but the handling speed after the replacement will be increased. On the other hand, if the mounting operation by the second preferred nozzle is chosen, the handling speed of components is slower compared to the case of the first preferred nozzle, but the additional time for the nozzle replacement is not necessary.

The right selection can be made instantly during the operation. That is, the CPU 20 calculates the required time for each case and automatically chooses the shorter sequence, as shown in FIG. 8. In the case above, the continuous mounting operation with the second preferred nozzle without nozzle replacement will be selected. However, this selection is made only if the substitution by the second preferred nozzle takes place once. If the same kind of components should be mounted for a plurality of times, the total length of required times will be compared and then the better sequence is selected. Usually, the mounting program is prepared to decrease the number of nozzle replacement procedures meaning that the replacement of the same nozzle is not repeated many times. Thus, the selection should be made between the one replacement and the replacements at continuous steps.

Furthermore, the alternative use of the second preferred nozzle is very effective in the following cases.

That is, the recommended nozzles for the component mounting are prepared, but the number of the nozzles is not enough. When there is a plurality of beams with a plurality of mounting heads on each beam (for example, the configuration with two beams and four heads), the pick-up and mounting operations (simultaneous operation) are done by a plurality of beams and heads. The utilization of one recommended nozzle should be shared by a plurality of heads for a plurality of mounting operations. Thus, the following situation may happen. That is, when the recommended nozzles have already mounted on certain heads and are in operation, other beams or other heads may need the same nozzles because of the component pick-up sequence which requires the same nozzle. With the conventional set-up method (only one nozzle type can be set up as recommended nozzle), the beams and heads which need the same nozzles should wait till other heads finish using the nozzle, or the processing of the component itself should be postponed. However, if the substitution by the second preferred nozzle is possible, it is not necessary to wait or to be postponed. By the use of alternative nozzle, the continuous operation becomes possible, increasing the flexibility of the operation.

By continuously operating with the alternative nozzle, without the replacement with the recommended nozzle, the whole processing time will be shortened because the nozzle replacement procedure is not required even if the handling speed is slower. The efficiency of the production is improved through the control which can instantly select the preferred sequence during the operation based on the calculation of the required time.

The above is a detailed description of particular embodiments of the invention. It is recognized that departures from the disclosed embodiments may be made within the scope of the invention and that obvious modifications will occur to a person skilled in the art. The full scope of the invention is set out in the claims that follow and their equivalents. Accordingly, the claims and specification should not construed to narrow the full scope of protection to which the invention is entitled.

What is claimed is:

1. An electronic component mounting apparatus comprising:

a mounting head which picks up an electronic component from an electronic component feeding apparatus for feeding a plurality of electronic components and mounts the electronic component on a print board;

a suction nozzle which is mounted on the mounting head and holds the electronic component;

a memory device storing parts library data which includes nozzle designation data for designating a plurality of suction nozzles of different types as designated suction nozzles for each type of the electronic components; and a control device for controlling the apparatus such that the designated suction nozzle picks up and mounts the corresponding electronic component based on the parts library data stored in the memory device, wherein the mounting apparatus is configured to use one of the designated suction nozzles to pick up one type of the electronic components and to use another of the designated suction nozzles to pick up said one type of the electronic components.

2. The electronic component mounting apparatus of claim 1, wherein the parts library data further includes control data for the designated suction nozzles.

3. The electronic component mounting apparatus of claim 1 or 2, wherein the parts library data includes an order of priority for selecting the suction nozzle for a use.

4. The electronic component mounting apparatus of claim 3, further comprising:

a nozzle stocker for storing the suction nozzles;

a memory device storing nozzle positioning data regarding locations of nozzles stored in the nozzle stocker; and a control device for selecting a suction nozzle according to the priority using the nozzle positioning data and the part library data.

5. The electronic component mounting apparatus of claim 1, wherein the parts library data includes data for determining validity of the designation of the nozzle type.

6. The electronic component mounting apparatus of claim 2, wherein the control data includes data regarding velocities of transportation of the suction nozzle.

7. The electronic component mounting apparatus of claim 4, wherein the parts library data includes data for determining validity of the designation of the nozzle type.

* * * * *